United States Patent [19]
Tsai

[11] Patent Number: 6,098,938
[45] Date of Patent: Aug. 8, 2000

[54] RETENTION MECHANISM FOR CASSETTE CPU MODULE

[76] Inventor: Tien-Ching Tsai, No. 28, Wu-Chuan 8 Rd., Wu-Ku Hsiang, Taipei Hsien, Taiwan

[21] Appl. No.: 09/186,120

[22] Filed: Nov. 4, 1998

[51] Int. Cl.[7] ...................................................... H05K 7/00
[52] U.S. Cl. ............................ 248/200; 248/694; 361/684
[58] Field of Search ................................... 248/694, 200, 248/27.3; 361/684, 685, 686, 687

[56] References Cited

U.S. PATENT DOCUMENTS

| Re. 35,344 | 10/1996 | Fry et al. | 248/27.3 X |
| 5,863,016 | 1/1999 | Makwinski et al. | 248/27.3 X |
| 5,886,871 | 3/1999 | Jeffries et al. | 361/687 X |

*Primary Examiner*—Leslie A. Braun
*Assistant Examiner*—A. Joseph Wujciak
*Attorney, Agent, or Firm*—Pro-Techtor International

[57] ABSTRACT

A structure of retention mechanism for cassette CPU module comprises a base, a retention groove, a movable piece, fixing plugs, insert pins, etc. The retention mechanism including a wall-suspended and a lever type may be applied to retain a cassette CPU module of either a snap or a cartridge type, and moreover, a flexible action portion and a snap fastening portion are disposed at end wall of the retention groove. When the retention mechanism at opposite ends are installed with a movable piece respectively, the coupled construction will provide a convenient and easy operation for mounting or dismounting a cassette CPU module by merely pushing the movable pieces up or down to fasten or unfasten.

12 Claims, 8 Drawing Sheets

RETENTION MECHANISM FOR CASSETTE CPU MODULE

BACKGROUND OF THE INVENTION

1. Field of the Invention

This invention relates to a retention mechanism for a cassette CPU module, particularly to an improved retention mechanism that can support a snap or a cartridge type CPU module.

2. Description of the Prior Art

Since the PENTIUM II processor made its debut on the stage, INTEL (a leading chip manufacturer has disclosed a serial CPU modules, wherein a CPU in cassette package, a heat sink, and a cooling fan are assembled together one after another on a interface card to form an easy replaceable mounting style. The cassette CPU module may be further classified in two mounting categories, a snap type and a cartridge type that are different in somewhat manner, so that a single common retention mechanism would be preferred to simplify mounting or dismounting of the cassette CPU module.

The interface card of CPU module is plugged into SLOT 1, and inasmuch as the CPU consumes considerable power dissipation, it may be damaged without a heat sink and/or a cooling fan. However, owing to the bulk volume of the cooling devices installed at one side of the interface card, the joint points between the same card and SLOT 1 will suffer an imbalance weight to result in a poor contact or even structural impairment.

Accordingly, a retention mechanism for reinforcement of the construction has been developed for guiding the CPU module when being plugged into the SLOT 1, and in virtue of fixing holes or snap fastening means to hold the cassette CPU module at position firmly for protection of the joint points.

Though the prior retention mechanism can fit both the snap and the cartridge type CPU modules, yet, hands or tools must be employed to pull or unclench one end after the other to detach a snap fastening portion from a fastening recess when trying to release the cassette CPU module in a limited space surrounded by other components. The dismounting job is not only tough but also prone to break the retention mechanism by an improper force.

The prior retention mechanism is fixed to a main board by pressing an insert pin, which will be retained by expending and snap fastening. In the case of dismounting the retention mechanism for some reason, due to a limited area for exerting pulling force, the expanded and snap fastened insert pin cannot be pulled out from the receptacle easily, and owing to lack of stopping point, the pulled out insert pin may fly to anywhere by a quick stroke.

Moreover, another prior retention mechanism uses a fixing cover to cover and snap fasten a snap type CPU module. When a cartridge type CPU module is taken to substitute that of the snap type for one reason or another, the fixing cover cannot be applied to the cartridge type because of different heights and shapes. Thus, the fixing cover has to be dismounted and deposited till next time when a snap type CPU module will be used again.

In view of the above-described defects, this invention is proposed to provide a new structure of retention mechanism for improvement.

SUMMARY OF THE INVENTION

This invention is to provide a common retention mechanism for a cassette CPU module fitting both snap type and cartridge type CPU modules.

Another object of this invention is to provide an improved structure of retention mechanism therefrom a snap type CPU module can be released easily by moving a movable piece to shove the snap fastening portion off the fastening recess.

With the foregoing merits, the structure of this retention mechanism for a cassette CPU module comprises a base, a retention groove, a movable piece, a fixing plug, and an insert pin, etc. After two positioning pins located at lower portion laterally to the retention groove are fixed to positioning holes in the base, the retention mechanism can be folded freely; the mounted movable piece on the retention groove is regulated by retaining flanges at its rear ends to move up and down within certain range. When an interface card is plugged into SLOT 1, the cassette CPU module will be snap retained by the retention groove without loosening or escaping; and by a sliding down of the movable piece, the interface card will be released from the retention groove.

BRIEF DESCRIPTION OF THE DRAWINGS

For a better understanding to the present invention, together with further advantages or features thereof, at least one preferred embodiment will be elucidated below with reference to the annexed drawings in which.

DETAILED DESCRIPTION OF THE PREFERRED EMBODIMENT

Figure 1:
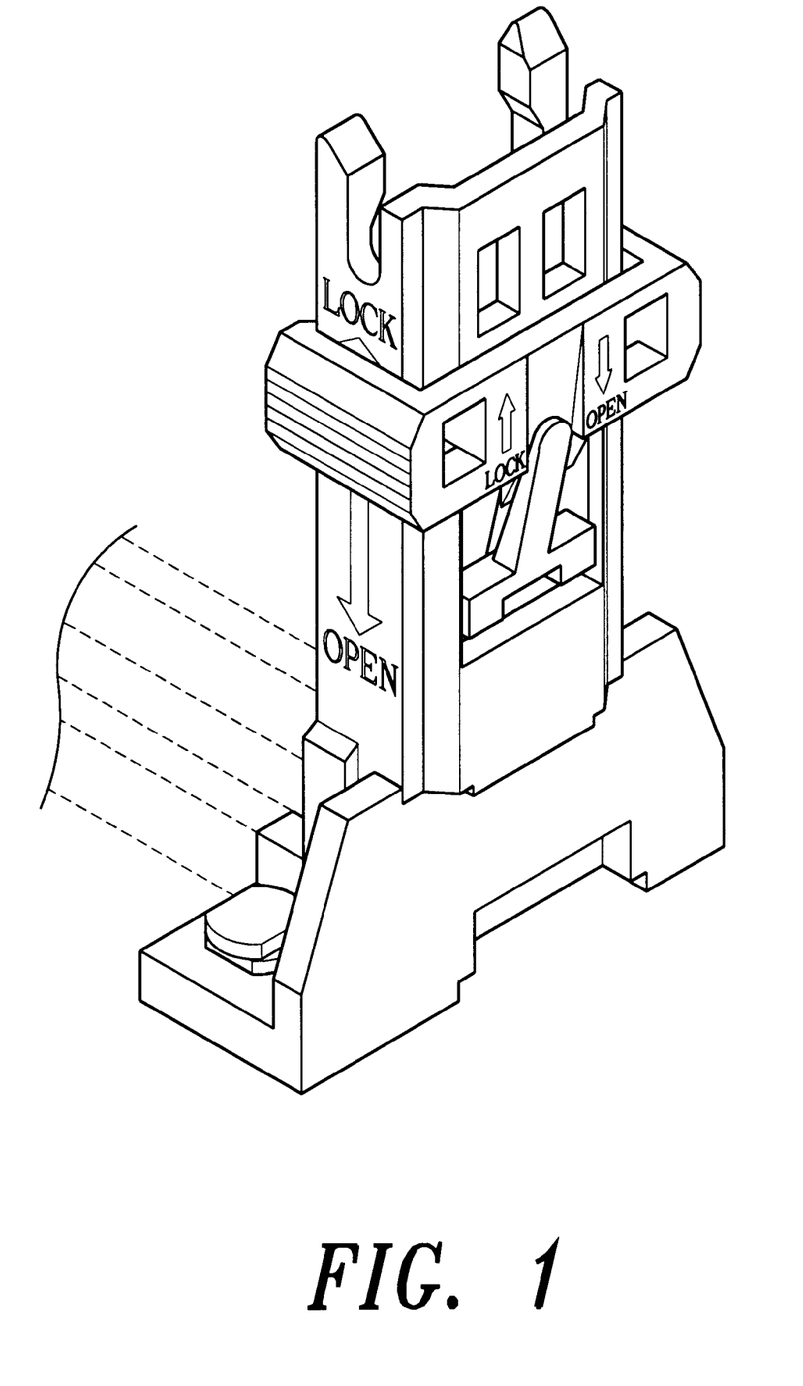
FIG. 1 is a schematic three-dimensional view showing structure of a wall-suspended type retention mechanism of this invention for a cassette CPU module.

As shown in FIG. 1, a connection bridge (dotted lines) may be established laterally and symmetrically to center of base of a wall-suspended retention mechanism respectively and extended in shape L to couple to another identical retention mechanism, or each of them may stand independently.

Figure 2:
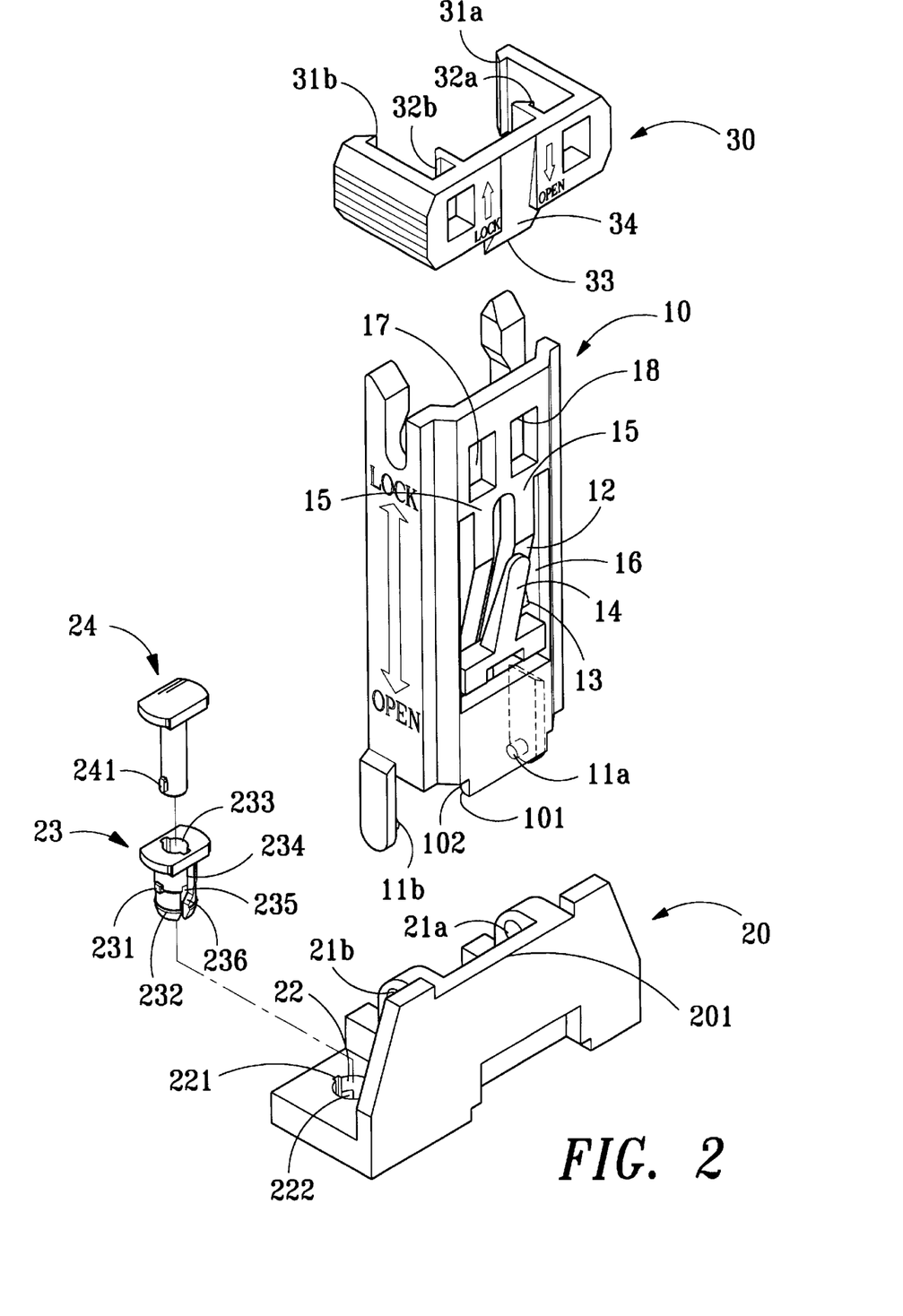
FIG. 2 is a schematic exploded view showing structure of a wall-suspended type retention mechanism of this invention for a cassette CPU module.

As shown in FIG. 2, a retention groove 10 combines a base 20 in a movable knock-down construction (or integral molded), wherein positioning holes 21a, 21b are attached to inside face of the vertical base wall, and at top edge thereof, a fixing recess 201 is formed. At lower portion laterally to the retention groove 10, positioning pins 11a, 11b are disposed, and at lower corners of the groove wall, vertical guide portions 101, and vertical fixing portions 102 are provided. After the positioning pins 11a, 11b are jointed at positioning holes 21a, 21b respectively, the retention mechanism can be folded freely to cooperate with the vertical guide portions 101 and the vertical fixing portions 102 for vertical fixing.

At the groove wall of the retention groove 10, a flexible action portion 12 and a snap fastening portion 13 are provided, wherein the flexible action portion 12 further comprises a clamp tongue 14, suspended wall joint portions 15, a recess 17, a fastening recess 18, and flute tracks 16. A movable piece 30 in U shape can be moved up and down within certain range on the retention mechanism, wherein the movable piece 30 further comprises retaining flanges 31a, 31b at rear ends, internal reversal snap fastening portions 32a, 32b coincident with inner wall of the retention groove 10 to form a dual-track snap fastening groove, and a guide slope portion 33 extended upwards to form a shoving portion 34. Two symmetrical through holes 22 are disposed in the base 20, wherein two flutes 221 are formed in opposite positions in each through hole 22, and in lower section thereof, a fixing portion 222 is arranged. Two positioning protrusions 231 in opposite position are provided laterally to a fixing plug 23, wherein a flange 232 is disposed at bottom portion, and a reception hole 233 at top. Two flutes 234 are formed in opposite positions in the reception hole 233, wherein the flutes 234 are extended downwards to meet a stopper 235 and an arc slope 236 thereunder. In fixing the base 20, put the fixing plug 23 into the through hole 22, turn slightly and let the positioning protrusion 231 rest underneath the fixing portion 222, then plug the fixing plug 23 into a main board 50. Two protrusions 241 are arranged laterally at bottom portion of the insert pin 24. Put the insert pin 24 into the fixing plug 23, the protrusions 241 will be guided by the arc slope 236 to rest at the stopper 235, and let the flange 232 latch firmly. Repeat the same to another through hole 22 for fixing the base 20. When dismounting the retention mechanism from the main board 50, all one has to do is pull the insert pins 24 up, the protrusions 241 will be limited by the stopper 235 instead of pulling out the insert pins 24 thoroughly, and the dismounting job can be easily done.

Figure 3A:
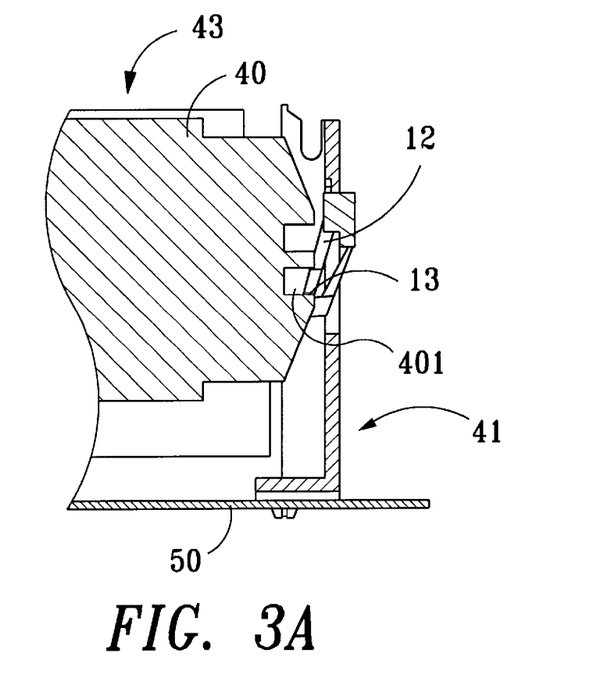
FIG. 3A indicates a snap type cassette CPU module in snap fastened state of a wall-suspended type retention mechanism of this invention when the movable piece does not move down.
Figure 3B:
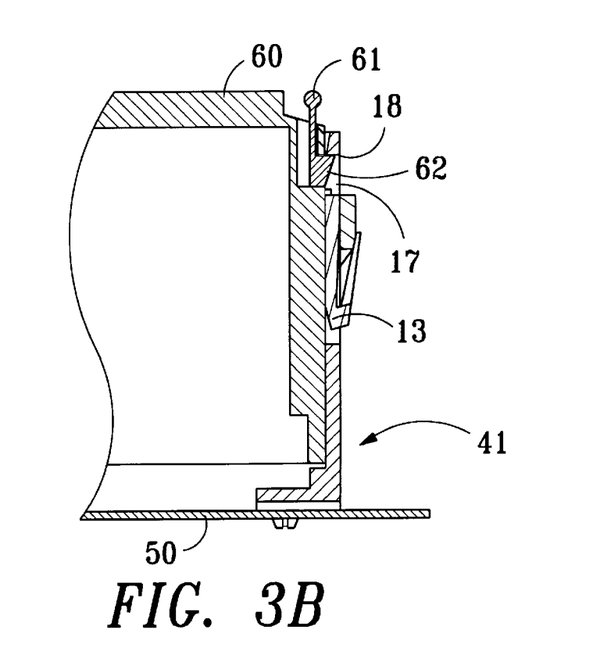
FIG. 3B indicates a cartridge type cassette CPU module in snap fastened state of a wall-suspended type retention mechanism of this invention when the movable piece does not move down.

As shown in FIG. 3A, when a snap type CPU module 43 is plugged into a wall-suspended type retention mechanism 41, owing to elasticity of the flexible action portion 12, the snap fastening portion 13 will be retained at a fastening recess 401 of a heat sink 40. As indicated in FIG. 3B, since no fastening recess 401 made as in heat sink 40, when a cartridge type CPU module 60 is plugged into a wall-suspended type retention mechanism 41 of this invention, the lower section of the flexible action portion 12 can only pinch the cartridge CPU module 60, however, in virtue of a knob 61 disposed on top of interface card of the cartridge type CPU module 60, when the knob 61 is pulled outwards, a protruded snap fixer 62 will be retained at the fastening recess 18 above the recess 17 of the retention mechanism 41 to attain same efficacy as in the snap type CPU module.

Figure 3C:
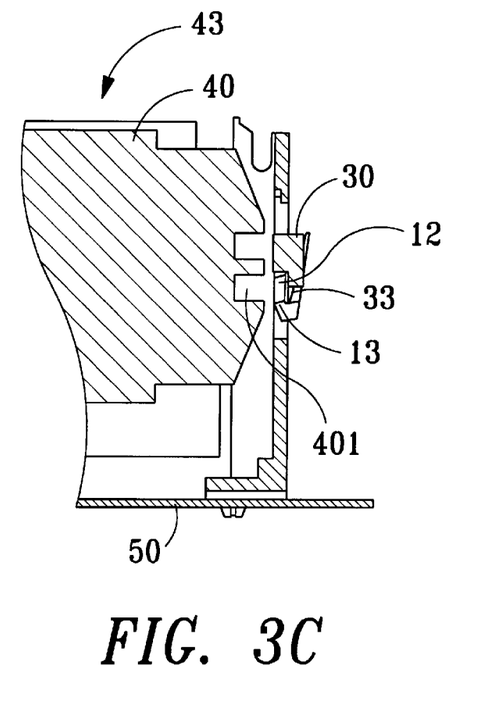
FIG. 3C indicates a snap type cassette CPU module released from a snap fastened state of a wall-suspended type retention mechanism of this invention when the movable piece moves down.
Figure 3D:
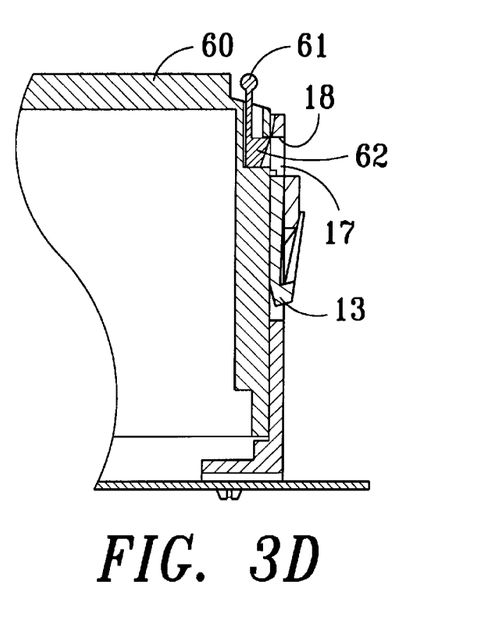
FIG. 3D indicates a cartridge type cassette CPU module released from a snap fastened state of a wall-suspended type retention mechanism of this invention when the movable piece moves down.

FIG. 3C indicates that when a user intends to remove the snap type CPU module 43, he can push the movable piece 30 downwards, then the shoving portion 34 will press the clamp tongue 14 to enable the flexible action portion 12 to move outwards, thus the snap fastening portion 13 will detach from the fastening recess 401 on the heat sink 40 to allow an easy removal of the snap type CPU module 43. Referring to FIG. 3D, the snap fastening portion 13 doesn't retain the cartridge type CPU module 60, all one has to do is pull the knob 61 on top of the CPU module 60 inwards, so that the snap fixer 62 will retreat from the fastening recess 18 of the recess 17 for removal of the cartridge type CPU module 60.

Figure 4:
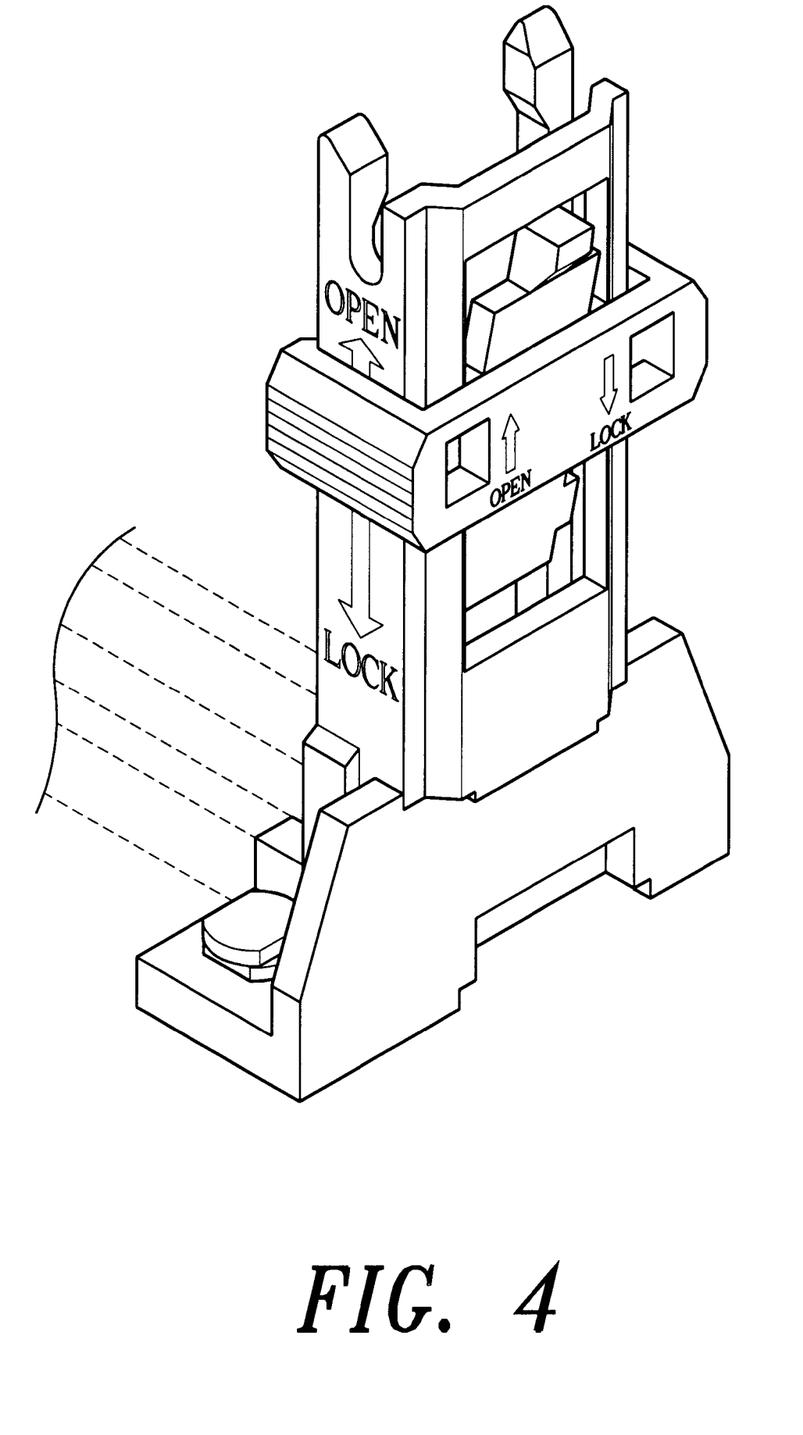
FIG. 4 is a schematic three-dimensional view of a lever type retention mechanism of this invention for a cassette CPU module.

As shown in FIG. 4, a connection bridge may be laid laterally at the base and extended in shape L for coupling to another retention mechanism, or each of them may stand independently.

Figure 5:
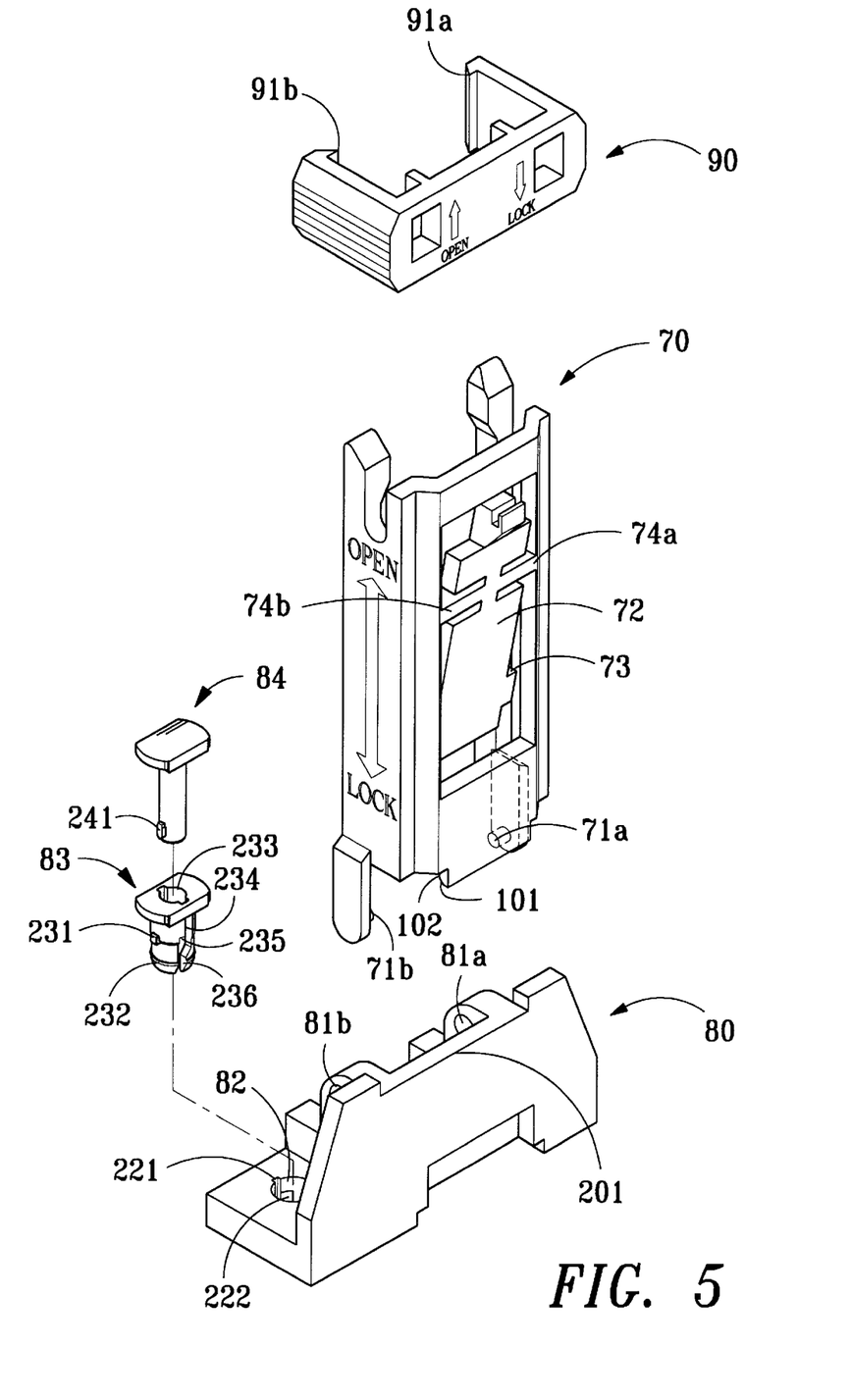
FIG. 5 is a schematic exploded view showing structure of a lever type retention mechanism of this invention for a cassette CPU module.

Referring to FIG. 5, the assembly of a lever type retention groove 70 and a base 80 is of a knock-down construction (can be integral molded), wherein positioning holes 81a, 81b are disposed laterally at one surface of the vertical wall in base 80, and positioning pins 71a, 71b are provided laterally at bottom portion respectively of the retention mechanism 70, and after pins 71a, 71b are installed at the positioning holes 81a, 81b, the retention mechanism can be folded freely. A flexible action portion 72 and a snap fastening portion 73 are offered at end wall of the retention groove 70, wherein support points 74a, 74b are taken as fulcrums of the flexible action portion 72. Retaining flanges 91a, 91b formed at tail ends of a U type movable piece 90 are coincidental with the lever type retention groove 70 to snap fasten each other. Through holes 82 are disposed in the base 80 to receive fixing plugs 83, and therein to insert pins 84 are plugged and latched for fixing the retention mechanism on a main board, as the way for fixing a wall-suspended type. The only difference with FIG. 2 is those two fulcrums 74a, 74b are supporting the flexible action portion 72, which will act like a lever when the movable piece 90 moves up and down.

Figure 6A:
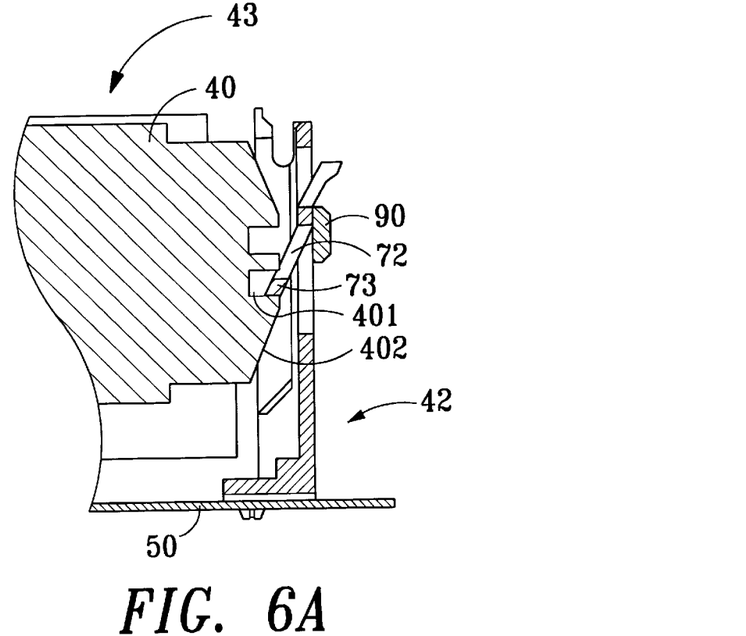
FIG. 6A indicates a snap type cassette CPU module in a snap fastened state of a lever type retention mechanism of this invention when the movable piece does not move up.

As shown in FIG. 6A, under normal conditions, when a snap type CPU module 43 is plugged into the lever type retention mechanism 42, a lateral oblique surface 402 will guide the snap fastening portion 73 to a fastening recess 401 of the heat sink 40 to get each other snap retained.

Figure 6B:
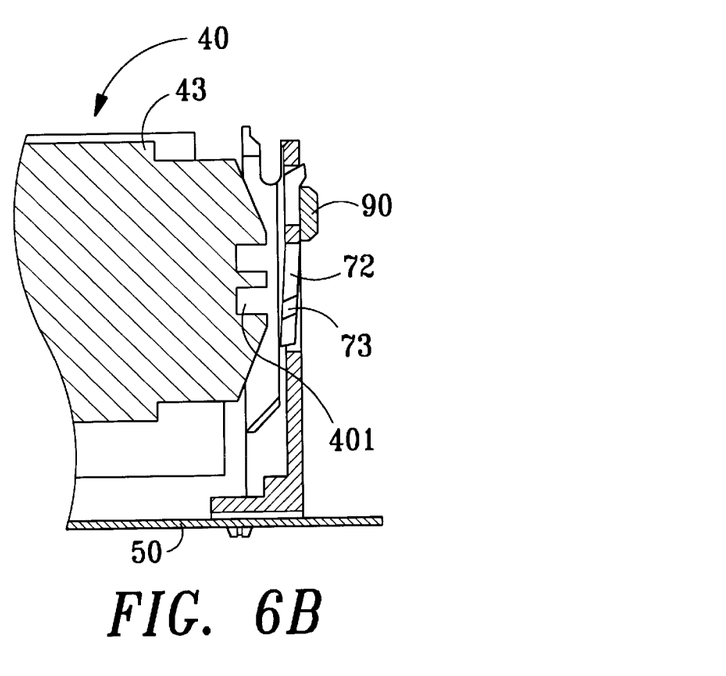
FIG. 6B indicates a snap type cassette CPU module released from a snap fastened state of a lever type retention mechanism of this invention when the movable piece moves up.

As shown in FIG. 6B, when a user intends to release and remove the heat sink 40, he needs only to push the movable piece 90 upwards, the flexible action portion 72 and the snap fastening portion 73 will go shoving outwards to force detachment from the fastening recess 401 of the heat sink 40, and thus the snap type CPU module 43 can be removed in an easy manner.

Besides, the lower section of the flexible action portion 72 in the lever type retention mechanism 42 can only pinch the cartridge type CPU module 60 (same with the wall-suspended type) without snap fastening joint, hence, it is required to pull the knob 61 of the CPU module 60 outwards to enable the protruded snap fixer 62 to be retained at the fastening recess locating above the recess 17 of the lever type retention mechanism 42; and it needs only to pull the knob inwards for removing the cartridge CPU module.

Figure 7:
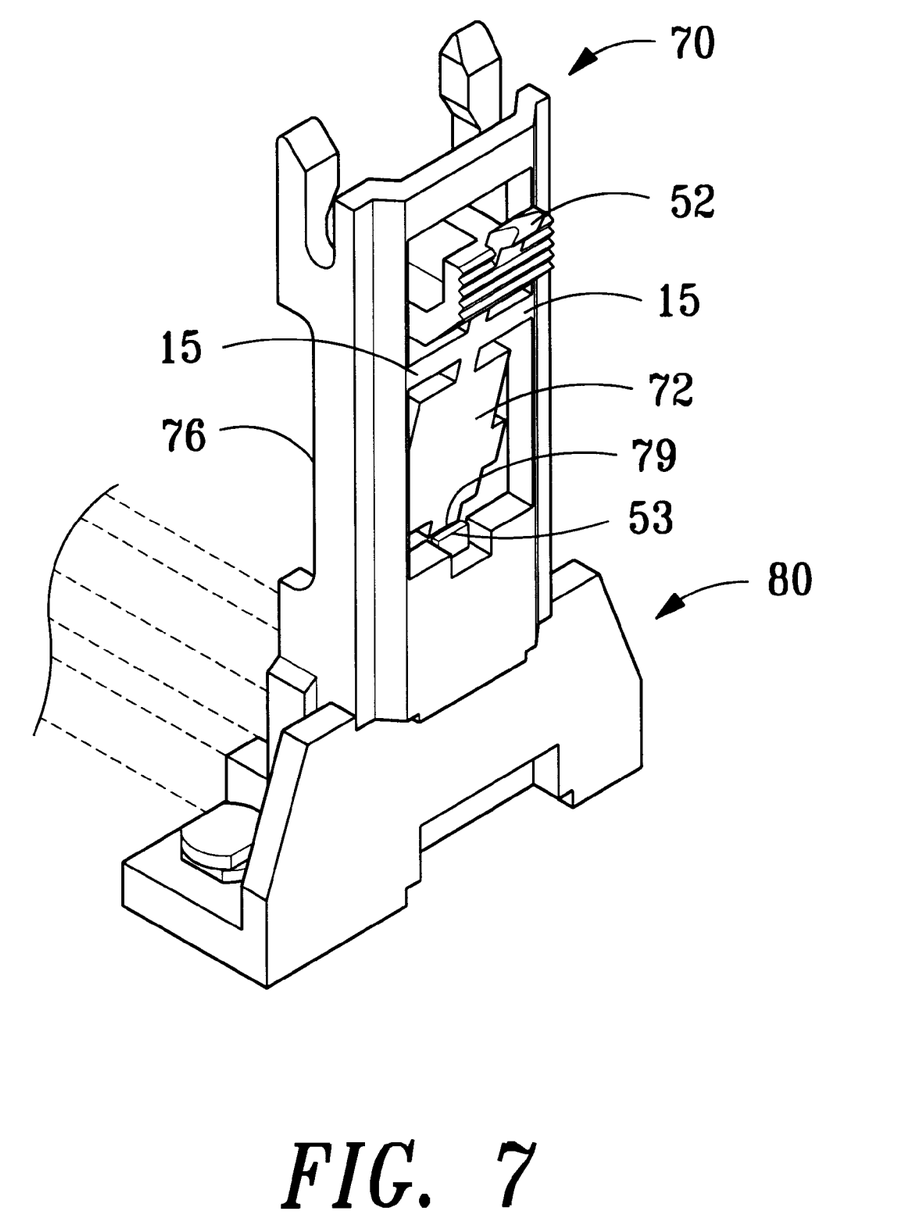
FIG. 7 indicates a lever type retention mechanism for a cassette CPU module in another form.

As shown in FIG. 7, the leverage principle is applied to this retention mechanism too, and a major different point with the aforementioned is that a pulling piece 52 is employed instead of the foregoing movable piece. When the pulling piece 52 located at upper portion of the retention mechanism 70 is pulled outwards, a positioning portion 79 at lower end of the flexible action portion 72 will detach from a positioning recess 53 and vice versa (no need a hand or tools for holding). Another recess 76 is formed laterally, either single or dual, to dodge other components. When this design is employed for a cartridge type CPU module, the fastening recess 18 locating above the recess 17 is still valid to attain same efficacy as of a snap type CPU module.

In comparison with above cited prior art or other conventional skills, the structure of retention mechanism for a cassette CPU module provided by this invention is more advantageous in:

1. A common retention mechanism is suitable for either a snap or a cartridge type cassette CPU module.

2. In virtue of a flexible action portion, a snap fastening portion, and a clamp tongue disposed in end wall of the retention mechanism cooperating with a movable piece shoving the snap fastening portion off a fastening recess can remove a snap type cassette CPU module from the retention mechanism easily and rapidly.

3. By using a movable piece being pushed to move within certain range, life of the retention mechanism can be prolonged.

In the above described, at least one preferred embodiment has been elucidated with reference to relating drawings annexed, it is apparent that numerous variations or modifications may be made without departing from the true spirit and scope thereof, as set forth in the following claims.

What is claimed is:

1. A retention mechanism for a cassette CPU module, comprising:

a retention groove having a flexible action portion and a snap fastening portion disposed at an end wall of said retention groove, wherein said flexible action portion further comprises a clamp tongue and connection portions, in an inner wall of said retention groove, flute tracks, vertical guide portions, and vertical fixing portions are disposed, and at a bottom of said retention groove positioning pins are provided on opposing inner sides thereof;

a base having two positioning holes therein and a fixing recess in a top edge of a vertical wall, and at least one through hole with a flute and a fixing portion formed therein;

a movable piece that is pushed to move up or down within a limited range, said movable piece further comprises retaining flanges, internal reversal snap fastening portions coincidental with said inner wall of said retention groove to form a dual-track snap fastening groove, a guide slope portion at a bottom end of said movable piece, and a pushing portion that extends upward from said guide slope portion;

a fixing plug which comprises two opposing positioning protrusions, a flange, and a centered reception hole;

an insert pin with two protrusions; wherein after said positioning pins of said retention groove are installed in said positioning holes in said base, said vertical guide portions, said vertical fixing portions, and said fixing recess enable said retention mechanism to be folded in a first position or to be fixed in a second vertical position; said movable piece fastened to said retention groove by retaining flanges being pushed up or down within a limited range by a user to enable movement from said first position to said second position.

2. The retention mechanism of claim 1, wherein said reception hole in said fixing plug further comprises flutes provided at two opposing positions, a stopper in a middle section, and an arc slope in a lower section.

3. The retention mechanism of claim 1, wherein said fixing plug is plugged into said through hole in said base, and by inserting said protrusions in said flutes and turning said fixing plug until said protrusions are received in said fixing portions, said insert pin is plugged into said reception hole of said fixing plug, and said protrusions on said insert pin are guided to rest underneath a stopper and are latched at said flanges according to an arc slope for fixing said retention mechanism on a main board; and wherein when dismounting of said retention mechanism is desired, up said insert pin is pulled upward, so that said protrusions of said insert pin contact said stopper, and said retention mechanism is easily removed.

4. The retention mechanism of claim 1, wherein a recess is formed in said retention groove.

5. A structure of a retention mechanism for a cassette CPU module, comprising:

a retention groove having a flexible action portion and a snap fastening portion disposed at an end wall of said retention groove, wherein said flexible action portion and said snap fastening portion are pushed outward and fixed, and at a bottom of said retention groove, two positioning pins are provided at opposing positions;

a base having at least one through hole therein, two positioning holes on an inner face and a fixing recess in a top edge of a vertical wall, wherein two flutes are formed at opposing positions and a fixing portion at a lower section are provided in each through hole;

a movable piece that is pushed to move up or down within a limited range, wherein said movable piece further comprises retaining flanges, and internal reversal snap fastening portions coincidental with an inner wall of said retention groove to form a dual-track snap fastening groove;

a fixing plug which comprises two positioning protrusions, a flange, and a centered reception hole;

an insert pin with two protrusions; wherein after said positioning pins of said retention groove are installed in said positioning holes in said base, said vertical guide portions, said vertical fixing portions, and said fixing recess enable said retention mechanism to be folded to a first position or to be vertically fixed in a second position; said movable piece fastened to said retention groove by retaining flanges at rear ends being pushed to move up or down within a limited range allowing said retention mechanism to be moved between said first and said second position.

6. The retention mechanism of claim 5, wherein said reception hole in said fixing plug further comprises flutes provided at two opposing positions, a stopper arranged in a middle section, and an arc slope in a lower section.

7. The retention mechanism of claim 5, wherein said fixing plug is plugged into said through hole in said base, and by turning said fixing plug until said protrusions are received in said fixing portions, said insert pin is plugged into said reception hole of said fixing plug the protrusions on said insert pin resting underneath a stopper and being latched at said flanges according to an arc slope for fixing said retention mechanism on a main board; and when dismounting of said retention mechanism is desired, said insert pin is pulled upward, allowing said retention mechanism to be moved between said first and said second position.

8. The retention mechanism of claim 5, wherein a recess is formed in said retention groove.

9. A structure of a retention mechanism for a cassette CPU module, comprising:

a retention groove having a flexible action portion and a snap fastening portion disposed at an end wall of said retention groove, wherein a pulling piece is attached at an upper portion of said retention groove, and a positioning portion is formed at a bottom end of said flexible action portion, and thereunder a corresponding positioning recess, said flexible action portion and said snap fastening portion are pushed outward and fixed, and at a bottom of said retention groove, a positioning pin is provided;

a base having at least one through hole therein, two positioning holes on inner face and a fixing recess in a top edge of a vertical wall, wherein two flutes formed at opposing positions and a fixing portion at a lower section are provided in each said through hole;

a fixing plug which comprises two positioning protrusions, a flange, and a centered reception hole;

an insert pin with two protrusions, such that after said positioning pins of said retention groove are installed in said positioning holes in said base, said vertical guide portions, said vertical fixing portions, and said fixing recess said retention mechanism to be folded to a first position or to be fixed in a second vertical position.

10. The retention mechanism of claim 9, wherein said reception hole in said fixing plug further comprises flutes provided at two opposing positions, a stopper arranged in a middle section, and an arc slope in a lower section.

11. The retention mechanism of claim 9, wherein said fixing plug is plugged into said through hole in said base, and by turning said fixing plug until said protrusions are received in said fixing portions, said insert pin is plugged into said reception hole of said fixing plug, said protrusions on said insert pin resting underneath a stopper and being latched at said flanges according to an arc slope for fixing said retention mechanism on a main board; and when dismounting of said retention mechanism is desired, said insert pin is pulled upward, allowing said retention mechanism to be moved between said first and said second position.

12. The retention mechanism of claim 9, wherein a recess is formed in said retention groove.

* * * * *